United States Patent
Barth et al.

(10) Patent No.: US 7,436,016 B2
(45) Date of Patent: Oct. 14, 2008

(54) MIM CAPACITOR WITH A CAP LAYER OVER THE CONDUCTIVE PLATES

(75) Inventors: Hans-Joachim Barth, Munich (DE); Petra Felsner, Munich (DE); Erdem Kaltalioglu, Hsin-Chu (TW); Gerald R. Friese, Munich (DE)

(73) Assignee: Infineon Technologies AG, Munich (DE)

( * ) Notice: Subject to any disclaimer, the term of this patent is extended or adjusted under 35 U.S.C. 154(b) by 94 days.

(21) Appl. No.: 11/210,094

(22) Filed: Aug. 23, 2005

(65) Prior Publication Data
US 2005/0282346 A1 Dec. 22, 2005

Related U.S. Application Data

(62) Division of application No. 10/429,469, filed on May 5, 2003, now Pat. No. 6,949,442.

(51) Int. Cl.
H01L 27/108 (2006.01)
(52) U.S. Cl. ............... 257/306; 257/303; 257/E21.008; 257/E21.009
(58) Field of Classification Search ................. 257/303, 257/306, E21.008, E21.009
See application file for complete search history.

(56) References Cited

U.S. PATENT DOCUMENTS

| | | | |
|---|---|---|---|
| 5,397,729 A | 3/1995 | Kayanuma et al. | |
| 5,547,890 A | 8/1996 | Tseng | |
| 5,731,220 A | 3/1998 | Tsu et al. | |
| 5,741,721 A | 4/1998 | Stevens | |
| 5,851,873 A | 12/1998 | Murai et al. | |
| 5,994,182 A | 11/1999 | Gonzalez et al. | |
| 6,066,892 A | 5/2000 | Ding et al. | |
| 6,087,213 A | 7/2000 | Murai et al. | |
| 6,159,790 A | 12/2000 | González et al. | |
| 6,197,650 B1 | 3/2001 | Wu | |
| 6,211,545 B1 | 4/2001 | Gonzalez et al. | |
| 6,221,730 B1 | 4/2001 | Honma | |
| 6,235,579 B1 | 5/2001 | Lou | |
| 6,238,964 B1 | 5/2001 | Cho | |
| 6,294,420 B1 | 9/2001 | Tsu et al. | |
| 6,313,003 B1 | 11/2001 | Chen | |
| 6,329,234 B1 | 12/2001 | Ma et al. | |

(Continued)

OTHER PUBLICATIONS

Kikkawa, T., "Current and Future Low-k Dielectrics for Cu Interconnects," 2000 IEEE.

(Continued)

Primary Examiner—Andy Huynh
(74) Attorney, Agent, or Firm—Slater & Matsil, L.L.P.

(57) ABSTRACT

A method for forming a MIM capacitor and a MIM capacitor device formed by same. A preferred embodiment comprises selectively forming a first cap layer over a wafer including a MIM capacitor bottom plate, and depositing an insulating layer over the MIM capacitor bottom plate. The insulating layer is patterned with a MIM capacitor top plate pattern, and a MIM dielectric material is deposited over the patterned insulating layer. A conductive material is deposited over the MIM dielectric material, and the wafer is planarized to remove the conductive material and MIM dielectric material from the top surface of the insulating layer and form a MIM capacitor top plate. A second cap layer is selectively formed over the MIM capacitor top plate.

22 Claims, 3 Drawing Sheets

U.S. PATENT DOCUMENTS

| | | | |
|---|---|---|---|
| 6,372,574 | B1 | 4/2002 | Lane et al. |
| 6,451,664 | B1 | 9/2002 | Barth et al. |
| 6,466,427 | B1 | 10/2002 | Chen |
| 6,509,267 | B1 | 1/2003 | Woo et al. |
| 6,576,525 | B2 | 6/2003 | Stamper |
| 6,579,785 | B2 | 6/2003 | Toyoda et al. |
| 6,593,185 | B1 | 7/2003 | Tsai et al. |
| 6,613,641 | B1 | 9/2003 | Volant et al. |
| 6,649,464 | B2 | 11/2003 | Lee |
| 6,670,237 | B1 | 12/2003 | Loh et al. |
| 6,716,741 | B2 | 4/2004 | Chang et al. |
| 6,794,262 | B2 | 9/2004 | Ning et al. |
| 6,893,959 | B2 | 5/2005 | Barth |
| 2002/0027286 | A1 | 3/2002 | Sundararajan et al. |
| 2002/0096775 | A1 | 7/2002 | Ning |
| 2003/0228749 | A1 | 12/2003 | Sinha et al. |

OTHER PUBLICATIONS

Kikkawa, T., "A photosensitive low-k interlayer-dielectric film for ULSIs," 2001 IEEE, pp. 348-351.

Liu, R., et al., "Single Mask Metal-Insulator-Metal (MIM) Capacitor with Copper Damascene Metallization for Sub-0.18μm Mixed Mode Signal and System-on-a-Chip (SoC) Applications," 2000 IEEE, Proceedings IITC, pp. 111-113.

Lopatin, S. D., et al., "Thin Electroless Barrier for Copper Films," SPIE Conference on Multilevel Interconnect Technology II, vol. 3508, Sep. 1998, Santa Clara, California, pp. 65-77.

Mahnkopf, R., et al., "'System on a Chip' Technology Platform for 0.18μm Digital, Mixed Signal & eDRAM Applications," 1999 IEEE, IEDM, pp. 849-852.

Segawa, Y., et al., "Manufacturing-ready Selectivity of CoWP Capping on Damascene Copper Interconnects," 2002 Conference Proceedings ULSI XVII, Materials Research Society, pp. 567-572.

MIM CAPACITOR WITH A CAP LAYER OVER THE CONDUCTIVE PLATES

This application is a divisional of patent application Ser. No. 10/429,469, entitled "Methods of Forming MIMS Capacitors," filed on May 5, 2003, now U.S. Pat No. 6,949,442 which application is incorporated herein by reference.

CROSS-REFERENCE TO RELATED APPLICATIONS

This application relates to commonly-assigned U.S. Pat. No. 6,893,959 B2, issued May 17, 2005, entitled, "Method to Form Selective Cap Layers on Metal Features with Narrow Spaces," which patent is hereby incorporated herein by reference.

TECHNICAL FIELD

The present invention relates generally to the fabrication of semiconductor devices, and more particularly to a method of manufacturing a metal-insulator-metal (MIM) capacitor and structure thereof.

BACKGROUND

Capacitors are used extensively in electronic devices for storing an electric charge. Capacitors essentially comprise two conductive plates separated by an insulator. Capacitors are used in filters, analog-to-digital converters, memory devices, various control applications, and mixed signal and analog devices, for example.

There is a demand in semiconductor device technology to integrate many different functions on a single chip, e.g. manufacturing analog and digital circuitry on the same die. MIM capacitor (MIMcap's) are often used in these integrated circuits. A MIM capacitor is a particular type of capacitor having two metal plates sandwiched around a capacitor dielectric that is parallel to a semiconductor wafer surface. They are rather large in size, being several hundred micrometers wide, for example, depending on the capacitance, which is much larger than a transistor or memory cell, for example. MIM capacitors are typically used as decoupling capacitors for microprocessor units (MPU's), RF capacitors in high frequency circuits, and filter and analog capacitors in mixed-signal products, as examples.

To form a MIM capacitor, the top capacitor metal plate is formed by a planar deposition of a conductive material, and lithographically patterning and etching the conductive material using a reactive ion etch (RIE) process, for example. The patterning of the top metal plate requires the use of a mask, and there can be alignment problems to underlying features (e.g., the MIM capacitor bottom plate) and vias to connect to interconnect layers.

Another problem in fabricating MIM capacitors is a restriction in the selection of the MIM dielectric materials, due to potential interaction with or diffusion of the metals (such as copper) used for the metal plates. The MIM dielectric material restriction may result in limited area capacitance.

Another problem in fabricating MIM capacitors is that, in order to avoid problems that arise in fabricating semiconductor devices using copper, often higher resistive plate materials such as aluminum, titanium nitride, and tungsten, as examples, are used for the top and bottom metal plates, which results in reduced high frequency capability. The use of copper, which has a lower resistivity, for the top and bottom metal plates is therefore desired. The use of copper for the top and bottom metal capacitor plates also produces a MIM capacitor having higher quality factors (Q-values).

A further problem in the manufacturing of MIM capacitors is etch stop problems during subsequent via etches. Vias are typically used to connect the top and bottom metal plates to subsequently formed metallization layers. Because of topography differences for the top and bottom metal plates, more insulating material must be etched to reach the bottom plate than to reach the top plate, and this can create etch stop problems when etching the vias.

What is needed in the art is an improved integration scheme for fabricating a MIM capacitor that solves these problems in the prior art.

SUMMARY OF THE INVENTION

These and other problems are generally solved or circumvented, and technical advantages are generally achieved, by preferred embodiments of the present invention, which provide an improved integration scheme for fabricating a MIM capacitor. The top plate of a MIM capacitor is formed in a damascene process, and both the top plate and bottom plate are covered with a cap layer that acts as a diffusion barrier. A mask is not required to pattern the top plate, but rather, the top plate is formed by the planarization of the damascene structure formed within an insulating material.

In accordance with a preferred embodiment of the present invention, a method of fabricating a MIM capacitor includes providing a semiconductor wafer, forming at least one first capacitor plate over the wafer, and forming a first insulating layer over the wafer, wherein a top surface of the at least one first capacitor plate is exposed. A first cap layer is selectively formed over the at least one first capacitor plate top surface, and a second insulating layer is formed over the first insulating layer and the first cap layer, the second insulating layer having a top surface. The second insulating layer is patterned with at least one second capacitor plate pattern, and a capacitor dielectric layer is deposited over the second insulating layer. A second capacitor plate material is deposited over the capacitor dielectric layer, and the wafer is planarized to remove the second capacitor plate material and capacitor dielectric layer from over the second insulating layer top surface and form at least one second capacitor plate within the patterned second insulating layer. The at least one second capacitor plate, capacitor dielectric layer and at least one first capacitor plate form a MIM capacitor.

In accordance with another preferred embodiment of the present invention, a MIM capacitor includes a semiconductor wafer, a first insulating material disposed over the wafer, and a first capacitor plate disposed over the semiconductor wafer within the first insulating material. The MIM capacitor includes a first cap layer disposed over the first capacitor plate, a second insulating layer disposed over the first insulating layer and first cap layer, and a capacitor dielectric disposed over and abutting at least a portion of the first cap layer within the second insulating layer. A second capacitor plate is disposed over and abutting the capacitor dielectric within the second insulating layer, and a second cap layer is disposed over the second capacitor plate.

Embodiments of the present invention achieve technical advantages by providing a simplified integration scheme for forming a MIM capacitor, resulting in a reduction in lithography steps, and reduced cost. The invention provides for increased area capacitance, because of a wider range of MIM capacitor dielectric materials that may be used. Because cap layers are used over the capacitor plates, the choice of the MIM capacitor dielectric is not limited by copper diffusion or by poor adhesion between the copper material and MIM capacitor dielectric material. The cap layers prevent affecting the copper of the capacitor plates during the MIM dielectric deposition. Embodiments of the invention result in the elimination or reduction of different via heights for vias for the top and bottom plates. Copper may be used as a material for the top and bottom plate in the integration scheme, which results in a higher frequency capability. Because the top plate is formed in a damascene process, after a planarizing step, a mask and etch process is not required to form the top plate, which solves alignment problems for the top plate. Thus, embodiments of the present invention solve several problems simultaneously.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of embodiments of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. Only one MIM capacitor is shown in each figure, although many MIM capacitors, other components and/or conductive lines may be present within each layer.

Figure 1:
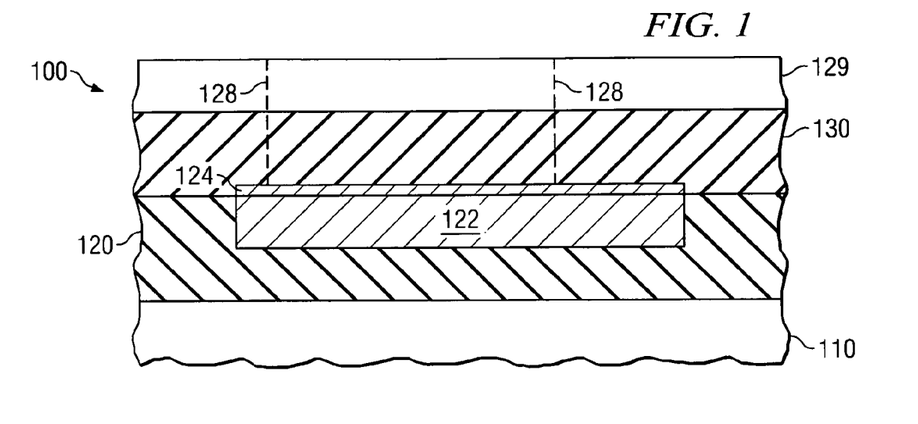
FIGS. 1, 2, and 3a show cross-sectional views of an embodiment of the present invention at various stages of fabrication, wherein cap layers are formed over the bottom capacitor plate and top capacitor plate, and wherein the top capacitor plate is formed in a damascene process.

With reference now to FIG. 1, therein is shown a semiconductor wafer 100 having a substrate 110. The substrate 110 typically comprises a semiconductor material such as single-crystal silicon, and may include other conductive layers or other semiconductor elements such as transistors or diodes, as examples (not shown). The substrate 110 may alternatively comprise compound semiconductors such as GaAs, InP, Si/Ge, SiC, as examples. The substrate 110 may also be referred to herein as a workpiece, and may comprise a silicon-on-insulator (SOI) substrate, for example. The substrate 110 or workpiece may include field oxide, active component regions, and/or shallow trench isolation or deep trench isolation regions, not shown.

A first insulating layer 120 is deposited or formed over the substrate 110. The first insulating layer 120 may comprise silicon dioxide, and may also comprise a low-dielectric constant material, having a dielectric constant k of 3.6 or less, for example. The first insulating layer 120 is patterned and etched with a pattern for a bottom capacitor plate in a damascene process, for example. The patterned first insulating layer 120 is filled with a first conductive material 122, and the wafer is planarized, e.g., using a chemical-mechanical polish process, to remove excess first conductive material 122 from the surface of the first insulating layer 120, for example. Alternatively, the bottom capacitor plate may be formed using a non-damascene process, such as by depositing and patterning the first conductive material 122, followed by the deposition of the first insulating material 120, for example, and planarization of the first insulating material 120 to remove excess first insulating material 120 from the top surface of the first conductive material 122.

The first conductive material 122 preferably comprises a metal such as a copper alloy, such as Cu—Al, Cu—Mg, Cu—Sn, Cu—In, Cu—Zr, and Cu—Ag, as examples. The first conductive material 122 may alternatively comprise aluminum, tungsten, titanium or copper, or combinations thereof, as examples. The first conductive material 122 may comprise a thickness ranging from 500 to 1000 nm, and more preferably may comprise a thickness of about 700 nm, for example. The first conductive material 122 may alternatively comprise other conductive materials, for example. The first conductive material 122 may include a liner (not shown; see 216 in FIG. 4).

In a preferred embodiment, the first conductive material 122 comprises copper, which has a low resistivity compared to other metals, for example. When copper or a copper alloy is used for the first conductive material 122, before the first conductive material 122 is deposited, a liner/copper seed layer combination (not shown in FIG. 1; see FIG. 4) may be deposited, as described for the formation of a bottom capacitive plate in U.S. Pat. No. 6,451,664 B1, entitled "Method of Making MIM Capacitor with Self-Passivating Plates," which is incorporated herein by reference. When the first conductive material 122 comprises copper, preferably, a liner is deposited over the first dielectric layer 120. The liner may comprise Ta, TaN, W, WN, Ti, TiN deposited by physical vapor deposition (PVD) or chemical vapor deposition (CVD), as examples. A seed layer is then deposited over the liner, the seed layer comprising a copper alloy seed layer deposited by PVD or CVD, as example. Then, the first conductive material 122 is deposited over the liner/seed layer by electroplating, PVD or CVD, as examples.

Referring again to FIG. 1, in accordance with an embodiment of the present invention, a first cap layer 124 is then formed over the first conductive material 122. The first cap layer 124 may comprise a self-passivating material as described in U.S. Pat. No. 6,451,664 B1, for example. In this embodiment, the first capacitor plate 122 is preferably formed in a damascene process. Forming the first capacitor plate comprises patterning the first insulating layer 120 with a pattern for the first capacitor plate, and depositing an alloy-containing seed layer (not shown in FIG. 1; see FIG. 4) over the patterned first insulating layer 120. The first conductive material 122 is then deposited over the seed layer. When the wafer is annealed, the first cap layer 124 is selectively formed by the dopants, e.g., the alloy in the seed layer for the first conductive material passivates the top surface of the at least one first capacitor plate 122 and forms the first cap layer 124. The first cap layer 124 is formed by the segregation of the dopants from the seed layer or alternatively, (for example, if a seed layer is not used) a dopant or alloy in the bulk first conductive material 122, to the top surface of the first conductive material 122. Note that the segregation of dopants during the anneal process results in the first cap layer 124 being formed at all surfaces of the first conductive material 122, including the sides and bottom surface, as described in U.S. Pat. No. 6,451,664 B1; however, only the passivated surface at the top surface is of concern in the present invention and is thus shown in the figures. Thus, in this embodiment, the first cap layer 124 comprises a dopant-rich layer, formed by annealing.

In accordance with another embodiment of the present invention, alternatively, the first cap layer 124 may comprise a selectively deposited material such as CoWP, CoP, CoWB, NiMoP, Re or Ru, as examples, as described in U.S. Pat. No. 6,893,959 B2 issued May 17, 2005 entitled, "Method to Form Selective Cap Layers on Metal Features with Narrow Spaces," which is incorporated herein by reference. In this embodiment, after the deposition of the first conductive material 122, the first conductive material 122 is recessed (not shown; see FIG. 6), and then a catalytic activation layer is formed over the top surface of the first conductive material 122. A conductive barrier layer is then selectively deposited over the catalytic activation barrier. The first cap layer 124 in this embodiment comprises the catalytic activation barrier and the conductive barrier layer, to be described further herein with reference to FIG. 6.

The first cap layer 124 protects the first conductive material 122 top surface from any reactive agents or chemicals introduced during the subsequent deposition of the MIM dielectric material. Next, an optional dielectric cap layer may be deposited over the exposed portions of the first insulating layer 120 and first cap layer 124 (not shown in FIG. 1; see FIG. 4 at 226).

Referring again to FIG. 1, next, in accordance with preferred embodiments of the present invention, a MIM capacitor top plate 134/136 and capacitor dielectric 132 are formed using a damascene process. A second insulating layer 130 is deposited over the exposed portions of the first insulating layer 120 and the first cap layer 124, (or over the optional dielectric cap layer, if one is used, not shown.) The second insulating layer 130 preferably comprises a conventional dielectric, such as an oxide, e.g., silicon dioxide, fluorinated silicate glass (FSG), a low dielectric constant material, such as SiLK™, Flare™, SiCOH, Coral™, Black Diamond™, or a porous low dielectric constant material, as examples.

Preferably, in accordance with one embodiment, the second insulating layer 130 is thin, comprising a thickness of 250 m or less, and more preferably comprising a thickness of 50 nm or less, for example. In this embodiment, the thin second insulating layer 130 allows the formation of a thin MIM capacitor dielectric layer and thin MIM capacitor top plate, e.g., having a thickness of about 50 to 150 nm or less each. This is advantageous, because the depth difference of the contacting vias to the top plate 136 and the bottom plate 122 can be reduced.

In another embodiment, the second insulating layer 130 is relatively thick, e.g., 300 to 1000 nm thick. In this embodiment, the MIM capacitor top plate 136 may not require a via connection, advantageously, because the top plate 136 can be contacted in a trough etch of a subsequent damascene interconnect level, for example, as shown in FIG. 3b, to be described further herein.

Referring again to FIG. 1, the second insulating layer 130 is patterned using photolithography and etch processes to create an opening 128 for the top plate, shown in phantom in FIG. 1. For example, a photoresist 129 may be deposited, exposed and developed, and the photoresist 129 may then be used to pattern the second insulating layer 130. A top surface of the first cap layer 124 is exposed after the patterning of the second insulating layer 130, for example. The etch process is preferably designed to stop on top of or within the first cap layer 124. Subsequently, the photoresist 129 is stripped.

If the first cap layer 124 comprises a self-passivation layer, a portion of the self-passivation layer may be removed during the etch process, due to an over-etch, for example. In this case, the self-passivation layer (e.g., first cap layer 124) may be repaired by an optional anneal step, e.g., at approximately 400 degrees C. or less, to induce another dopant segregation and copper self-passivation, for example.

In one embodiment of the present invention, the second insulating layer 130 comprises a photosensitive low-k material, such as methylsilsesquiazane (MSZ), having a dielectric constant k of approximately 2.7, porous MSZ, having a k of less than 2.7, or another mechanically stable and photosensitive material, as examples. Advantageously, the etch and strip processes may not be required, if a photosensitive low-k material is used for the second insulating layer 130 material. The patterning of the second insulating layer 130 is preferably by UV lithography or electron beam irradiation, when the second insulating layer 130 comprises a photosensitive low-k material. Advantageously, the etch and strip may be omitted in this case, providing a cost savings.

Figure 2:
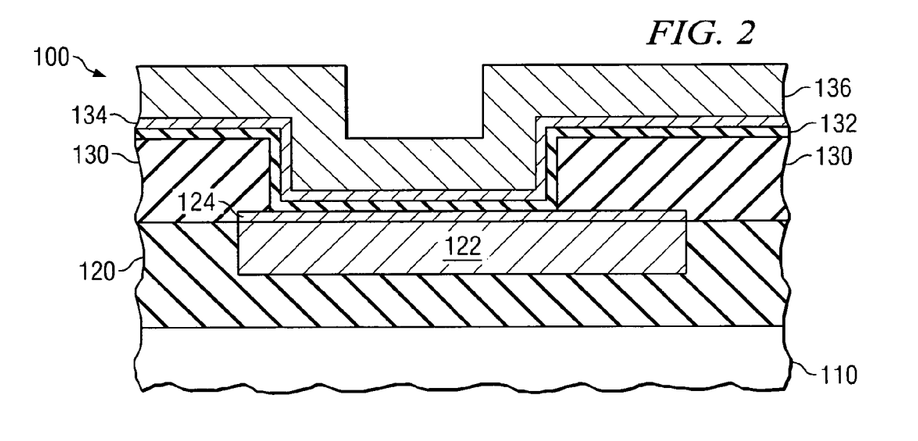

Referring now to FIG. 2, a capacitor dielectric material layer 132 is deposited over the patterned second insulating layer 130 and exposed first cap layer 124 top surface. The capacitor dielectric layer 132 typically comprises an insulator, such as silicon dioxide or silicon nitride, and alternatively, the capacitor dielectric layer 132 may comprise high dielectric constant materials, for example. The capacitor dielectric layer 132 may alternatively comprise other dielectric materials. The capacitor dielectric layer 132 may be about 540 Angstroms thick or less, for example, and may alternatively comprise 1000 Angstroms or less, for example. The capacitor dielectric layer 132 is preferably conformal and is evenly deposited over the top surface and sidewalls of the patterned second insulating layer 130 and top surface of the exposed first cap layer 124, for example.

Because the bottom capacitor plate 122 includes a first cap layer 124, the bottom plate 122 surface is passivated, allowing an increased selection of materials for the MIM capacitor dielectric layer 132. For example, the MIM capacitor dielectric material layer 132 may comprise an oxide, silicon nitride, or various high k materials, such as $Al_2O_3$, $Ta_2O_5$, or BSTO, as examples. The MIM capacitor dielectric material layer 132 may be deposited using atomic-layer CVD, and may comprise a highly conformal and/or low temperature dielectric material, for example.

A second conductive material 136 is formed or deposited over the capacitor dielectric layer 132. The second conductive material 136 typically comprises a metal such as aluminum, tungsten, titanium, or copper, or combinations thereof. The second conductive material 136 may be 600 Angstroms thick, for example, and may alternatively comprise 1000 Angstroms or less, for example. The second conductive material 136 may alternatively comprise other conductive materials, for example. However, in accordance with a preferred embodiment of the present invention, the second conductive material 136 comprises copper or a copper alloy, such as Cu—Al, Cu—Mg, Cu—Sn, Cu—In, Cu—Zr, or Cu—Ag, as examples, due to the lower resistivity of copper and to achieve improved electrical results.

When copper or a copper alloy is used for the second conductive material 136, before the second conductive material 136 is deposited, a liner/copper seed layer 134 combination may be deposited, as described for the formation of a bottom capacitive plate in U.S. Pat. No. 6,451,664 B1, for example. A liner is deposited over the capacitor dielectric layer 132. The liner may comprise Ta, TaN, W, WN, Ti, TiN deposited by PVD or CVD, as example. A seed layer is deposited over the liner, the seed layer comprising a copper alloy seed layer deposited by PVD or CVD, as an example. Then, the second conductive material 136 is deposited over the liner/seed layer 134 by electroplating, PVD or CVD, as examples.

Figure 3A:
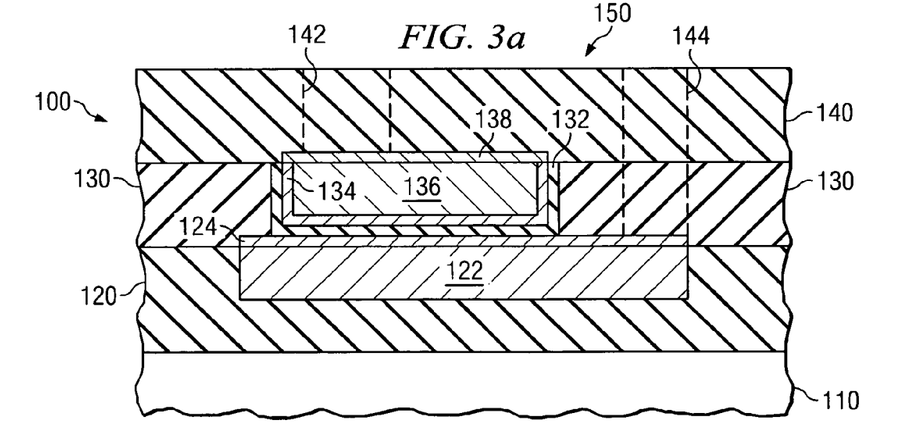
Figure 3B:
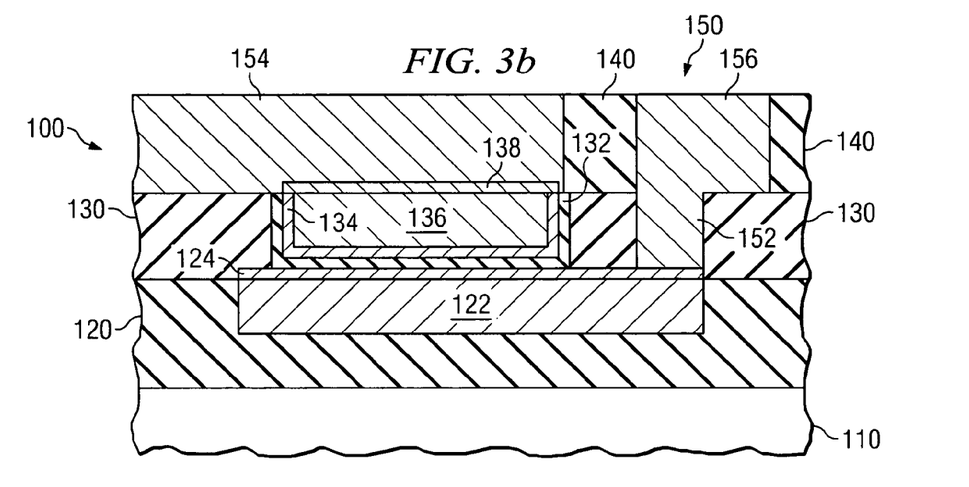
FIG. 3b shows an embodiment of the invention, wherein a trough for conductive line is formed in a subsequent insulating layer, making electrical contact of a conductive line directly to the top plate.

Excess second conductive material 136, liner/seed layer 134, and capacitor dielectric layer 132 are then removed from the top surface of the second insulating layer 130, using a CMP process, or RIE, as examples, as shown in FIG. 3a. Advantageously, the top plate material 134/136 does not need to be patterned using lithography. Rather, because the second insulating layer 130 has been patterned before deposition of the top plate materials 134/136, the planarization of the second insulating layer 130 forms the top plate 134/136 and also patterns the capacitor dielectric layer 132.

Next, shown in FIG. 3a, in an optional step, a second cap layer 138 may be formed on the top surface of the second conductive material 136, as described for the first conductive material 122. The second cap layer 138 may be formed in a similar process as described for the first cap layer 124, for example. The second cap layer 138 may comprise a self-passivating material, such as a dopant-rich layer, formed by annealing, or alternatively, the second cap layer 138 may comprise a selectively deposited material such as CoWP, CoWB, CoP, NiMoP, Re or Ru, as examples. The second cap layer 138 protects the second conductive material 136 top surface from any reactive agents or chemicals introduced during the subsequent deposition of a dielectric material, to be described further herein.

The MIM capacitor 150 comprises bottom plate 122/124, capacitor dielectric 132, and top plate 134/136/138. Additional dielectric or insulating layers such as a third insulating layer 140 may then be deposited and a single or dual damascene process sequence may be continued, to pattern and fill the next via and wiring levels, for example. The third insulating layer 140 and second insulating layer 130 may be patterned and etched with first vias 142 to the MIMcap top plate 132/134/136 and second vias 144 to the MIMcap bottom plate 122/124, for example, as shown in phantom in FIG. 3a.

If the second insulating layer 130 is thin, as in a preferred embodiment of the invention, then there is less variation in the height of the first vias 142 and the second vias 144, advantageously.

In accordance with one embodiment of the present invention, shown in FIG. 3b, the second insulating layer 130 is relatively thick, e.g., 300 to 1000 nm thick. In this embodiment, the MIM capacitor top plate 136 may not require a via connection, advantageously, because the top plate 136 can be contacted in a trough etch of a subsequent damascene interconnect level 140, for example, as shown. In this embodiment, the only part of the second insulating layer 130 that must be opened is the via 152 to the bottom plate 122/124. The second insulating layer 130 and third insulating layer 140 in this embodiment may be patterned in a dual damascene process (e.g., second insulating layer 130 is patterned, followed by the patterning of the third insulating layer 140, or vice versa). In a single fill process, conductive line 154 that abut the top metal plate 134/136/138, via 152, and conductive line 156 that is an extension of via 152 are formed at once. Excess conductive material is then removed from the top surface of the third insulating layer 140, e.g. in a planarization step. In this embodiment, only the MIM capacitor bottom plate 122/124 needs to be contacted by vias, but those may be patterned on the same metallization level as conductive lines 154 to the top plate and other contacting vias e.g., for other elements of the semiconductor wafer (not shown) are formed, as shown in FIG. 3b. This is advantageous because all vias to be patterned (e.g. for the MIM capacitor bottom plate) will have the same depth, which solves some of the etch stop problems found in prior art MIM capacitor fabrication.

Figure 4:
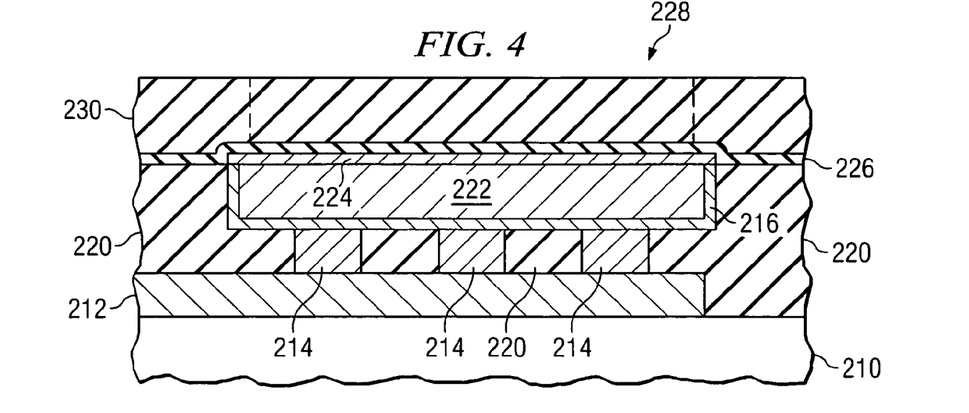
FIGS. 4 and 5 illustrate cross-sectional views of an embodiment of the invention at various stages of fabrication, wherein the bottom capacitor plate makes electrical contact to an underlying interconnect layer.
Figure 5:
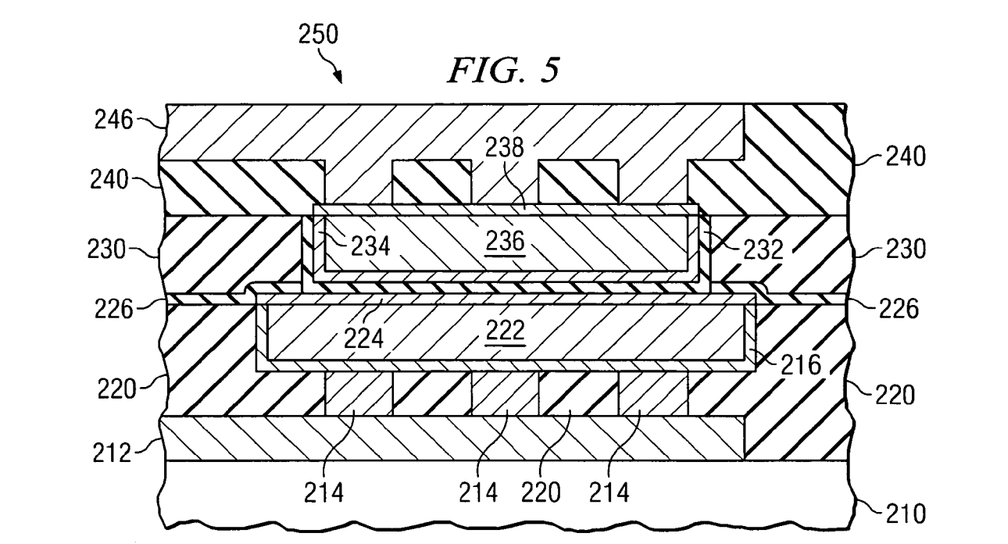

Another embodiment of the present invention is shown in FIGS. 4 and 5. While not all preferred and alternative materials are described herein with reference to FIGS. 4, 5 and 6 to avoid repetition, corresponding numerals are used that were used to describe FIGS. 1 through 3. For example, element 1xx in FIGS. 1-3 corresponds to and preferably comprises similar materials and thickness as element 2xx in FIGS. 4 and 5, and element 3xx in FIG. 6.

In the embodiment shown in FIG. 4, first metallization lines 212 are formed beneath the bottom plate 216/222 before the bottom plate 216/222 is formed. Vias 214 are formed in the first insulating layer 220 to contact the bottom plate 216/222. The bottom plate 216/222 includes a liner 216, which may comprise a bi-layer of a liner such as TaN, TiN, WN, Ta or combinations thereof, as examples, and a seed layer comprising a copper alloy, for example. First insulating layer 220 may include three separate dielectric layers (not shown), one for the first metallization lines 212, one layer for vias 214, and another layer for the MIM capacitor bottom plate 216/222, for example.

After the bottom plate 216/222 is formed, a first cap layer 224 is formed over the first conductive material 222. The first cap layer 224 may comprise a self-passivating layer formed by annealing, or may alternatively comprise a selective deposition of CoWP, CoP or Ru, as examples.

After the first cap layer 224 is formed, a dielectric cap layer 226 is deposited or formed over the first cap layer 224 and exposed portions of the first insulating layer 220. The dielectric cap layer 226 preferably comprises SiN, SiC, SiCN or BloK™ or another dielectric material with diffusion barrier properties against metal ion or metal atom diffusion, as examples. Alternatively, the dielectric cap layer 226 may comprise other dielectric materials. The second insulating layer 230 is deposited over the dielectric cap layer 226, and the second insulating layer 230 and dielectric cap layer 226 are patterned with the top plate pattern 228, as shown in phantom in FIG. 4.

A MIM capacitor dielectric layer 232 is deposited or formed over the patterned second insulating layer 230, and a liner/seed layer 234 is deposited over the capacitor dielectric layer 232. A second conductive material 236 is deposited over the liner/seed layer 234. The wafer is planarized to form the MIM capacitor top plate, which comprises liner/seed layer 232 and conductive material 236. A second cap layer 238 is selectively formed over the MIMcap top plate 234/236. A third insulating layer 240 is deposited over the MIM capacitor 250, and the third insulating layer 240 is patterned with vias 242 and second metallization lines 246, for example, in a dual damascene process. Note that the vias 242 contain the same height, solving the etch stop problems of prior art via formation due to the varying depths of the vias for contacting the top plate 234/236/238 and bottom plate 216/222/224. The patterned third insulating layer 240 is filled with a conductive material to form vias 242 and second metallization lines 246.

Note that because the first and second cap layers 124, 224, 138, and 238 preferably comprise a metal and are conductive, after the formation of the first and second cap layers, the capacitor plates are considered to also comprise the first and second cap layers.

Figure 6:
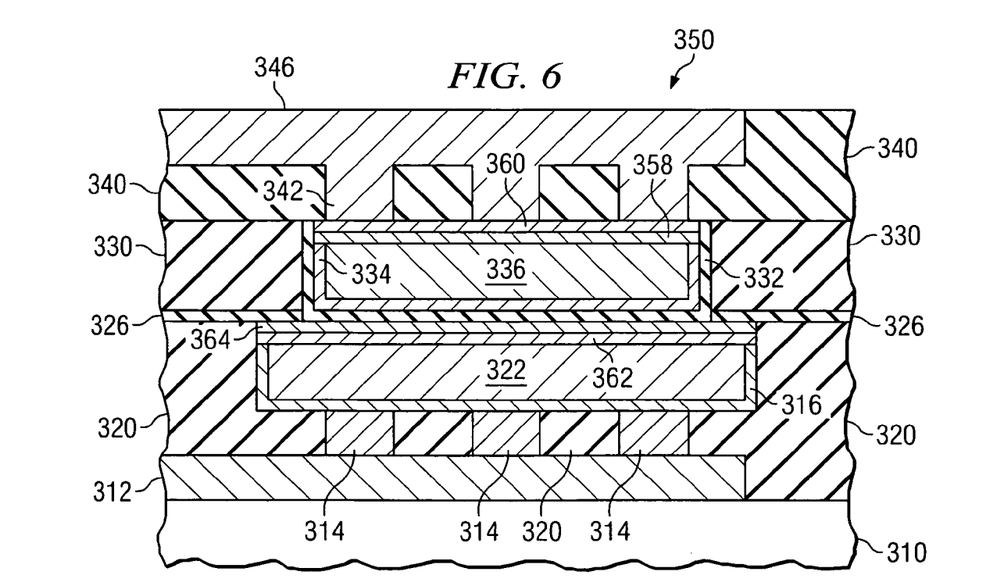
FIG. 6 shows and embodiment of the invention, wherein cap layers are formed on the bottom and top capacitor plates by recessing the plate conductive material, forming a catalytic activation layer over the conductive material, and selectively forming a conductive barrier layer within the conductive material recess.

Another embodiment of the present invention is shown in FIG. 6. In this embodiment, the cap layers for the bottom and top capacitor plates are formed as described in U.S. Pat. No. 6,893,959 B2 issued May 17, 2005 entitled, "Method to Form Selective Cap Layers on Metal Features with Narrow Spaces," which is incorporated herein by reference. After the deposition and patterning of the first insulating layer 320, an optional liner 316 is deposited or formed over the first insulating layer 320. The first conductive material 322 is deposited or formed and then recessed to a height slightly below, e.g., 20 nm or less, below the top surface of the first insulating layer 320. All or a portion of the liner 316 may be removed during the recessing of the first conductive material 322, depending on the method used to recess the first conductive material 322.

A catalytic activation layer 362 is then deposited over the top surface of the first conductive material 322. The catalytic activation layer 362 may comprise palladium (Pd) deposited in a layer of approximately one to three atoms thick, for example.

A conductive barrier layer 364 is then deposited over the catalytic activation layer 362. The conductive barrier layer 364 preferably comprises a material such as CoWP, CoP, CoWB, NiMoP, Re or Ru, as examples. If any excess conductive barrier layer 364 resides on the top surface of the first insulating layer 320, it is preferably removed, resulting in the conductive barrier layer 364 having a top surface that is co-planar with the top surface of the first insulating layer 320. In this embodiment, the cap layer for the bottom capacitor plate comprises catalytic activation layer 362 and conductive barrier layer 364. The MIM capacitor 350 is then fabricated as described herein for the other embodiments.

After the deposition of the second conductive material 336, again, as described for the bottom plate 316/322/362/364, the second conductive material 336 is recessed below the top surface of the second insulating layer 330, e.g., 20 nm or less, below the top surface of the second insulating layer 330. A portion of or all of the optional liner 334 may be removed during the recessing of the second insulating layer 330.

A catalytic activation layer 358 comprising, for example, one to three atom layers of Pd, is then deposited over the top surface of the second conductive material 322. A conductive barrier layer 360 comprises a material such as CoWP, CoP, CoWB, NiMoP, Re or Ru, as examples, is then deposited over the catalytic activation layer 358. In an optional step, excess conductive barrier layer 360 on the top surface of the second insulating layer 330 is removed, resulting in the conductive barrier layer 360 having a top surface that is co-planar with the top surface of the second insulating layer 330. In this embodiment, the cap layer for the top capacitor plate comprises catalytic activation layer 358 and conductive barrier layer 360. The MIM capacitor 350 includes bottom plate 316/322/362/364, capacitor dielectric 332, and top plate 334/336/358/360.

Embodiments of the present invention provided a simplified integration scheme for forming a MIM capacitor 150/250/350, a reduction in lithography steps, and reduced cost. The novel integration schemes for fabricating a MIM capacitor described herein solve several problems simultaneously. First, embodiments of the present invention provide for increased area capacitance, because of a wider range of MIM capacitor dielectric materials that may be used. The choice of the MIM capacitor dielectric is not limited by copper diffusion or by poor adhesion between the copper material and MIM capacitor dielectric material, or by affecting the copper during the MIM dielectric deposition, because of the barrier provided by the first cap layers 124, 224 and 362/364 and second cap layers 138, 238 and 358/360. Problems with the via etch process due to topography differences using an etch stop may be solved, resulting in the reduction of (FIGS. 1, 2 and 3a) or elimination of (FIGS. 3b, 4, 5 and 6) different via heights between the vias for the top and bottom plates. Copper may be used in the integration scheme for the top capacitor plate conductive material 122, 222 and 322 and bottom capacitor plate conductive material 136, 236 and 336, which results in a higher frequency capability of the MIM capacitor 150/250/350 and a MIM capacitor 150/250/350 having a higher Q factor. Because the top plate is formed in a damascene process, after a CMP step, a mask and etch process is not required to form the top plate, which solves alignment problems for the top plate.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the materials and process steps may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A metal-insulator-metal (MIM) capacitor, comprising:
a first insulating material formed over a wafer;
a first capacitor plate formed over the wafer within the first insulating material and over an alloy-containing seed layer located within the first insulating material and comprising an annealed and passivated top surface;
said annealed and passivated top surface of said first capacitor plate comprising a conductive first cap layer over the first capacitor plate, the conductive first cap layer comprising material that has migrated from the alloy-containing seed layer;
a second capacitor plate adjacent the first capacitor plate; and
a capacitor dielectric disposed between the first capacitor plate and the second capacitor plate.

2. The MIM capacitor of claim 1, wherein the first capacitor plate comprises copper.

3. The MIM capacitor of claim 1, further comprising:
a second insulating layer formed over the first insulating layer and the first cap layer; and
a dielectric cap layer located between the first insulating material and the second insulating material.

4. The MIM capacitor of claim 3, wherein the dielectric cap layer comprises SiN, SiC, SiCN or BloK™, or a dielectric material with diffusion barrier properties against metal ion or metal atom diffusion.

5. The MIM capacitor of claim 1, further comprising:
a second insulating layer formed over the first insulating layer and the first cap layer, wherein the second insulating layer has a thickness of 250 nm or less;
wherein the capacitor dielectric is formed over the first cap layer within the second insulating layer.

6. The MIM capacitor of claim 1, further comprising a second insulating layer formed over the first insulating layer and the first cap layer, wherein the second insulating layer comprises oxide, silicon dioxide, fluorinated silicate glass (FSG), a low dielectric constant material, a porous low dielectric constant material, a photosensitive low-k material, methylsilsesquiazane (MSZ), or combinations thereof.

7. The MIM capacitor of claim 1, wherein the capacitor dielectric is physically contacting at least a portion of the first cap layer.

8. The MIM capacitor of claim 1, wherein said at least one conductive material includes an alloy containing seed layer and said material from said at least one conductive material in said first cap layer is from said seed layer.

9. The MIM capacitor of claim 1, wherein said at least one conductive material includes a dopant and said dopant comprises said material from said at least one conductive material in said first cap layer.

10. A metal-insulator-metal (MIM) capacitor, comprising:
a first insulating material formed over a wafer;
a first capacitor plate formed over the wafer within the first insulating material and over an alloy-containing seed layer located within the first insulating material;
a first cap layer over the first capacitor plate, the first cap layer formed by passivating a top surface of the first capacitor plate from annealing, the first cap layer being conductive and the first cap layer comprising material from the alloy-containing seed layer;
a second capacitor plate adjacent the first capacitor plate;
a capacitor dielectric disposed between the first capacitor plate and the second capacitor plate;
a second insulating layer formed over the first insulating layer and the first cap layer;
a second conductive cap layer formed over the second capacitor plate;
wherein the capacitor dielectric is formed over and abutting at least a portion of the first cap layer within the second insulating layer; and
wherein the second capacitor plate is formed over the capacitor dielectric within the second insulating layer.

11. The MIM capacitor of claim 10, further comprising:
a third insulating layer formed over the second cap layer and the second insulating layer;
a first conductive line formed in the third insulating layer abutting the second cap layer;
a conductive via formed in the second insulating layer abutting the first cap layer; and
a second conductive line formed in the third insulating layer abutting the via.

12. The MIM capacitor of claim 10, wherein the second capacitor plate comprises copper.

13. A metal-insulator-metal (MIM) capacitor, comprising:
a first insulating material formed over a wafer;
a first capacitor plate formed over the wafer within the first insulating material;
a second insulating layer formed over the first insulating layer;
a capacitor dielectric formed over the first capacitor plate within the second insulating layer;
a second capacitor plate formed over the capacitor dielectric within the second insulating layer and over an alloy-containing seed layer located within the second insulating material, the alloy-containing seed layer being over the capacitor dielectric; and
a second-plate cap layer over the second capacitor plate, the second-plate cap layer being conductive and the second-plate cap layer comprising material from the alloy-containing seed layer.

14. The MIM capacitor of claim 13, wherein the second insulating layer has a thickness of 250 nm or less.

15. A metal-insulator-metal (MIM) capacitor, comprising:
a first insulating material formed over a wafer;
a first capacitor plate formed of at least one conductive material over the wafer within the first insulating material and comprising an annealed and passivated top surface portion, said top surface portion of said first capacitor plate comprising a first cap layer, the first cap layer being conductive and the first cap layer comprising material from said at least one conductive material;
a capacitor dielectric disposed over the first capacitor plate, and
a second capacitor plate disposed over the capacitor dielectric.

16. The MIM capacitor of claim 15, wherein the first capacitor plate comprises copper.

17. The MIM capacitor of claim 15, further comprising:
a second insulating layer formed over the first insulating layer; and
a dielectric cap layer located between the first insulating material and the second insulating material.

18. The MIM capacitor of claim 17, wherein the dielectric cap layer comprises SiN, SiC, SiCN or BloK™, or a dielectric material with diffusion barrier properties against metal ion or metal atom diffusion.

19. The MIM capacitor of claim 15, wherein said capacitor dielectric abuts at least a portion of the first cap layer within the second insulating layer, further comprising:
a second insulating layer formed over the first insulating layer and the first cap layer;

a second capacitor plate formed over the capacitor dielectric within the second insulating layer; and a second conductive cap layer formed over the second capacitor plate.

20. The MIM capacitor of claim 19, further comprising:

a third insulating layer formed over the second cap layer and the second insulating layer;

a first conductive line formed in the third insulating layer abutting the second cap layer;

a conductive via formed in the second insulating layer abutting the first cap layer; and a second conductive line formed in the third insulating layer abutting the via.

21. The MIM capacitor of claim 15, further comprising a second insulating layer formed over the first insulating layer and the first cap layer, wherein the second insulating layer comprises oxide, silicon dioxide, fluorinated silicate glass (FSG), a low dielectric constant material, a porous low dielectric constant material, a photosensitive low-k material, methylsilsesquiazane (MSZ), or combinations thereof.

22. The MIM capacitor of claim 15, wherein the capacitor dielectric is abutting at least a portion of the first cap layer.

* * * * *

UNITED STATES PATENT AND TRADEMARK OFFICE
CERTIFICATE OF CORRECTION

PATENT NO. : 7,436,016 B2  Page 1 of 1
APPLICATION NO. : 11/210094
DATED : October 14, 2008
INVENTOR(S) : Barth et al.

It is certified that error appears in the above-identified patent and that said Letters Patent is hereby corrected as shown below:

In Col. 5, line 67, delete "m" and insert --nm--.

Signed and Sealed this

Twenty-seventh Day of January, 2009

JOHN DOLL
*Acting Director of the United States Patent and Trademark Office*